(12) United States Patent
Bladh

(10) Patent No.: US 6,324,236 B1
(45) Date of Patent: Nov. 27, 2001

(54) PHASE DETECTOR ARRANGEMENT

(75) Inventor: Mats Bladh, Tullinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/078,978

(22) Filed: May 14, 1998

(30) Foreign Application Priority Data

May 15, 1997 (SE) .................................................. 9701805

(51) Int. Cl.[7] .................................................. H03D 3/24
(52) U.S. Cl. .................... 375/375; 375/376; 327/147; 327/157; 331/25
(58) Field of Search ..................... 375/375, 376; 327/156, 157, 147; 331/1 A, 1 R, 17, 25

(56) References Cited

U.S. PATENT DOCUMENTS

| | | | |
|---|---|---|---|
| 4,238,740 | * 12/1980 | Crue | 331/17 |
| 4,321,483 | * 3/1982 | Dugan | 307/269 |
| 4,371,974 | * 2/1983 | Dugan | 375/82 |
| 4,380,815 | * 4/1983 | Clendening | 375/80 |
| 4,400,667 | 8/1983 | Belkin . | |
| 4,412,338 | * 10/1983 | Hendrikson | 375/82 |
| 4,546,486 | * 10/1985 | Evans | 375/119 |
| 4,823,363 | * 4/1989 | Yoshida | 375/120 |
| 4,988,955 | * 1/1991 | Horie | 331/11 |
| 5,056,118 | * 10/1991 | Sun | 375/106 |
| 5,126,602 | * 6/1992 | Lee et al. | 307/510 |
| 5,164,966 | 11/1992 | Hershberger . | |
| 5,248,969 | * 9/1993 | Lee et al. | 341/73 |
| 5,406,590 | * 4/1995 | Miller et al. | 375/376 |
| 5,548,249 | 8/1996 | Sumita et al. . | |
| 5,652,531 | * 7/1997 | Co et al. | 327/12 |
| 5,757,652 | * 5/1998 | Blazo et al. | 364/487 |
| 5,949,264 | * 9/1999 | Lo | 327/157 |
| 5,966,033 | * 10/1999 | Miller | 327/3 |
| 6,097,255 | * 8/2000 | Tachi | 331/25 |

* cited by examiner

Primary Examiner—Stephen Chin
Assistant Examiner—Dac V. Ha
(74) Attorney, Agent, or Firm—Burns, Doane, Swecker & Mathis, L.L.P.

(57) ABSTRACT

A phase detector arrangement for use in a phase locked loop circuit recovers clock and data pulses from a data stream comprising Return to Zero (RZ) signals including digital data. The arrangement includes a comparator, a phase detector, a loop filter, and a voltage controlled oscillator. The phase detector includes a phase position indicator which is activated by each incoming data pulse in the output line of the comparator. A method for recovering clock and data pulses includes the steps of monitoring the data pulses in each output line of the comparator and controlling the voltage controlled oscillator in relation to both edges of each data pulse, for clocking data synchronously with the pulse.

22 Claims, 2 Drawing Sheets

PHASE DETECTOR ARRANGEMENT

TECHNICAL FIELD

The present invention relates to a phase detector arrangement for use in a phase locked loop circuit, for recovery of clock and data pulses from a data stream which comprises Return to Zero RZ signals comprising digital data, said arrangement comprising a comparator, a phase detector, a loop filter and a voltage controlled oscillator, wherein the phase detector comprises a phase position indicator which is activated by each incoming data pulse in the output line of the comparator, said phase position indicator being adapted to control the voltage controlled oscillator in relation to both edges of each data pulse, for clocking data synchronously with said data pulse. The present invention also relates to a method for recovery of clock and data pulses from a received data stream which comprises Return to Zero RZ signals comprising digital data and is received via a comparator, said arrangement comprising a phase detector, a loop filter and a voltage controlled oscillator, wherein the data pulses in the or each output line of the comparator are monitored and the voltage controlled oscillator is controlled in relation to both edges of each data pulse, for clocking synchronously with said data pulse.

In the field of single line digital communication, the recovery of clock and data pulses from a received RZ-signal can be accomplished by means of a tank circuit. A tank circuit comprises LC-filters that filters out the clock frequency from the timing contents of the input signal plus a sine/square wave converter that converts it into a square wave digital clock signal.

These solutions are cost-efficient and are often applied to traditional PDH-equipment. One peculiarity with tank circuits is that the clock signal disappears about 10–20 pulses after that the input signal has disappeared. While the tank circuits are capable to withstand a tremendously jittered input signal, they are not good at dampening jitter and they are not good at enduring noise. There is also a risk of producing jitter within said circuits.

Another solution is to use a phase locked loop circuit for clock and data recovery. This type of circuit is more flexible and may for example be made more narrow-banded than tank circuit solutions, and is therefore able to damp jitter more efficiently and is less sensitive to noise and maintains the clock signal even if the input signal is missing. Commonly used phase detectors, for example of the type Phase-Frequency comparators, Exclusive-or or Set-Reset flip-flop, all being present within the circuit 74HC4046, require input signals continuously each period from signal and reference in order to be able to detect the phase position correctly. These phase detectors can not work upon RZ signals.

In order to be able to detect the phase position of a RZ signal, for example of any of the types B3ZS, HDB-3, AMI or RZ, and the clock with which the data should be recovered, the comparison must be made exclusively with those parts of the signal which provide a pulse of the type RZ. It would be possible to measure the time it takes from the front edge of the RZ-signal to the desired clock-edge. This may be accomplished analogously or digitally by means of digital counters. One drawback with counters is that the clock frequency to the counters must be considerably higher than that of the clock and data that is to be recovered, if a high phase position accuracy is desirable. This may be a problem at high frequencies, among other with regard to technology, power consumption and cost.

SUMMARY

What is needed is therefore a cost-efficient phase detector arrangement which is able to operate at high frequencies with low power.

According to the invention, this is accomplished by connecting the phase position indicator output in series via a resistor to an earth-connected capacitor, for integration of the output signal with reference to the duration of each data pulse to a mean value which corresponds to the phase position between the data pulse and the clock signal.

In a particular embodiment of the invention, the output line of the phase detector is connected to the voltage controlled oscillator via the loop filter.

The comparator may be provided with two output lines and the phase detector may comprise two phase position indicators, wherein either one or the other indicator is activated for each incoming data pulse in the output lines of the comparator. These phase position indicators may be mutually connected to a connection point and from said point connected in series via the resistor to the earth-connected capacitor.

The clock signal of the voltage controlled oscillator may be used as input to the phase detector.

The voltage over the capacitor may be used for controlling the output phase of the voltage controlled oscillator.

The or each phase position indicator may be a tristate buffer. Alternatively, each phase position indicator may be an analogue switch.

The arrangement according to the invention may be used in a telecommunication system.

The method according to the invention comprises the steps of integrating the input signal controlled by or each output line with reference to the duration of each pulse to a mean value which corresponds to the phase position between the data pulse and the clock signal.

The clock signal may be used to be switched out as phase position pulses.

BRIEF DESCRIPTION OF THE DRAWINGS

The invention will in the following be further described in a non-limiting way with reference to the accompanying drawings in which.

DETAILED DESCRIPTION

Figure 1:
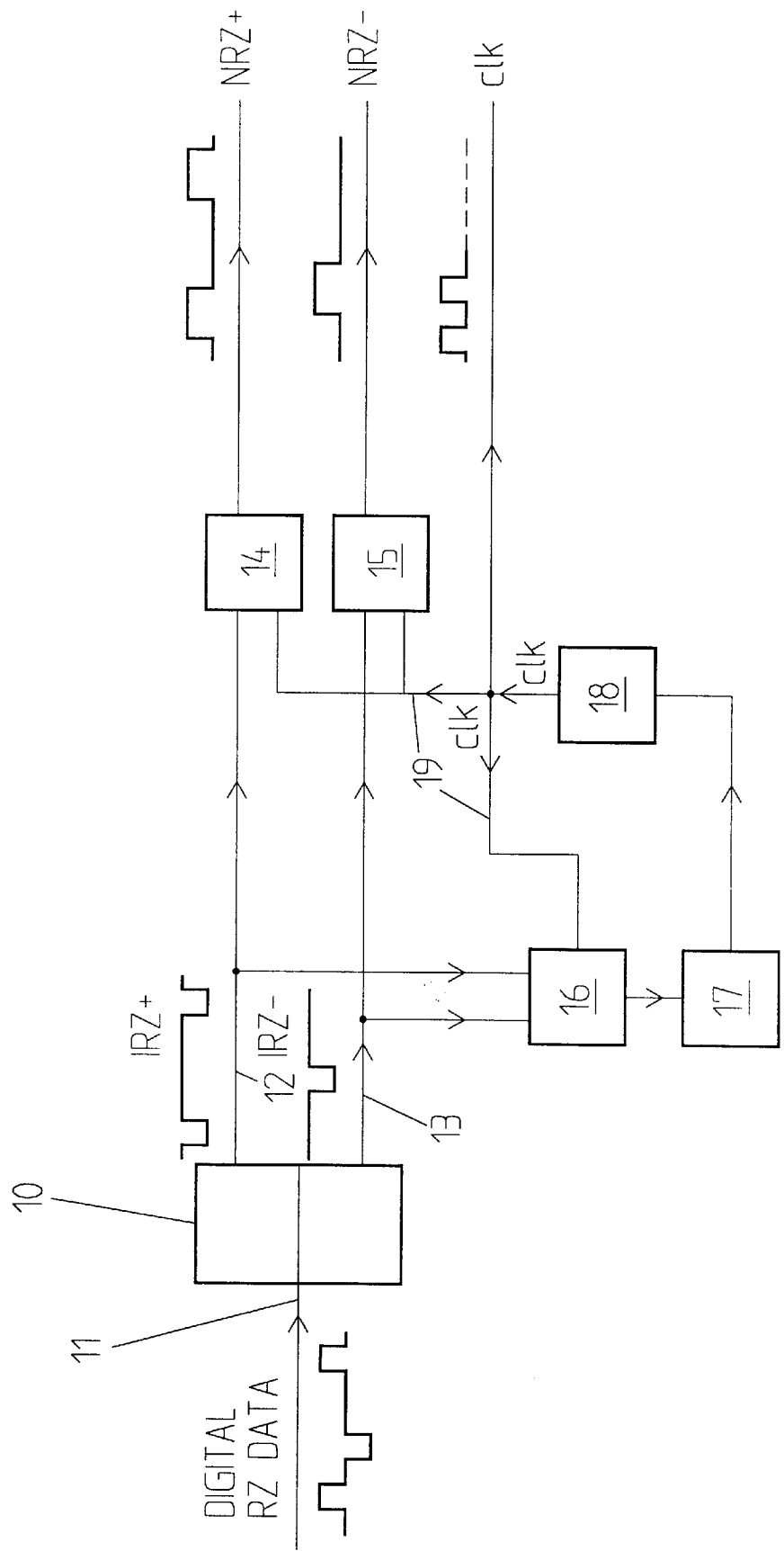
FIG. 1 is a circuit diagram showing the phase detector arrangement according to the invention, and FIG. 2 schematically illustrates a phase detector circuit which is included in the phase detector arrangement according to FIG. 1.

The circuit diagram in FIG. 1 shows the structure of a NRZ data and clock recovering circuit for bipolar RZ-signals according to the present invention.

As shown in this figure, the PLL circuit comprises a comparator 10 with a data signal input line 11. Each of two data signal output lines 12, 13 from said comparator is connected to a respective D-flip-flop 14 and 15.

A phase locked loop is connected to lines 12, 13 and comprises a phase detector 16, a loop filter 17 and a voltage controlled oscillator 18. The VCO 18 is controlled by the phase detector 16 via the loop filter 17.

The intention is to convert the input bipolar RZ signals to a digital NRZ and a clock signal. The phase detector receives two different signals via the connections to lines 12, 13 from the comparator 10 which converts a bipolar RZ signal to inverse RZ data (Return to Zero) to IRZ+=0, IRZ−=1 for positive input pulse, IRZ+=1, IRZ−=0 for negative pulse and IRZ+=1, IRZ−=1 for no input pulse. The VCO 18 controls the frequency of the clock clk, line 19, and thus the clocking of the two D-flip-flops 14 and 15 which in turn clock the inverted RZ-data to NRZ-data.

Figure 2:
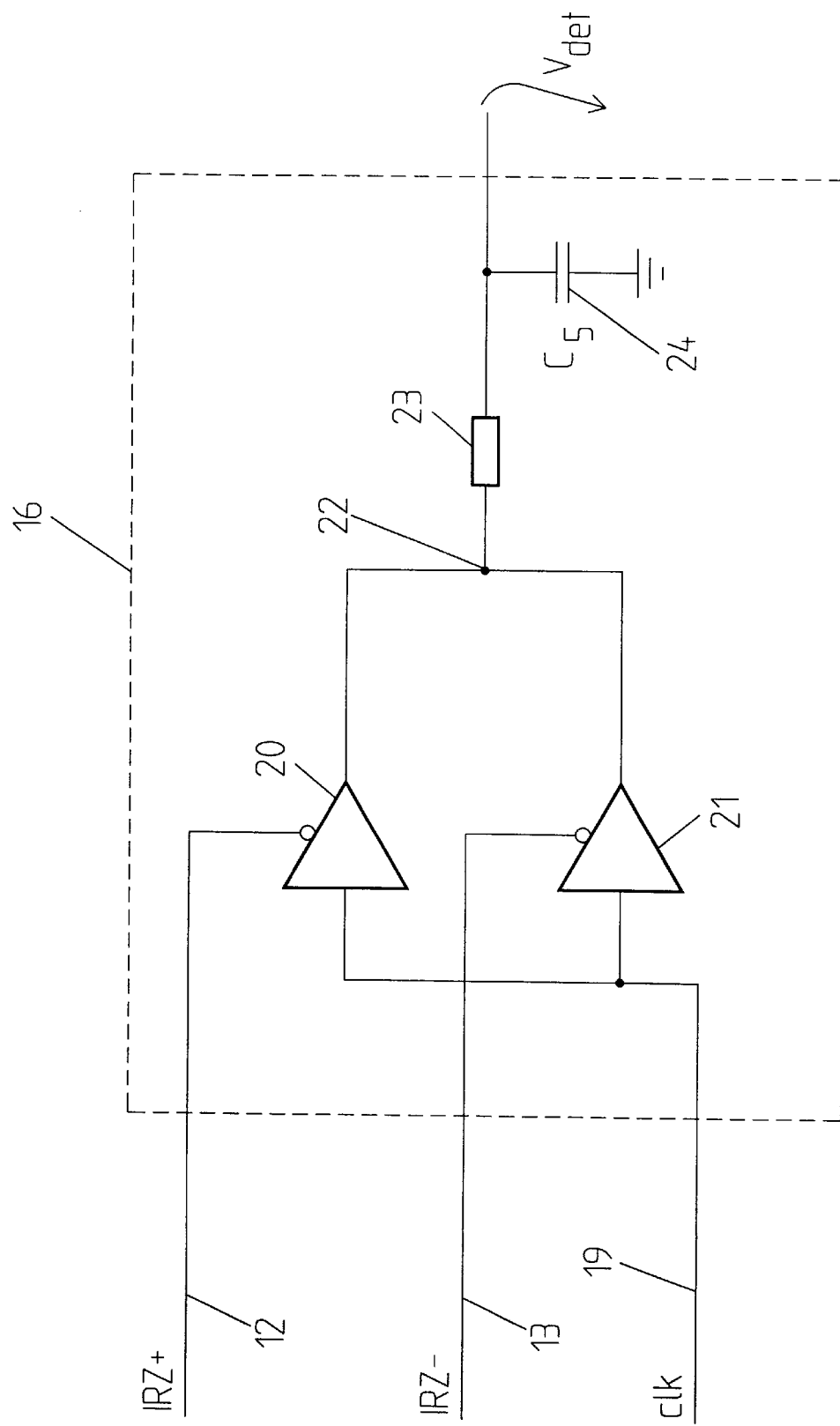

The phase detector 16 is shown in FIG. 2 and it comprises two phase position indicators 20 and 21 which are mutually connected to a connection point 22 and from this point 22 via a resistor 23 to an earth-connected capacitor 24.

The phase detector circuit operates in such a way, that for each input data pulse created by IRZ+ or IRZ−, either the phase position indicator 20 or 21 is activated. The VCO clock 18 delivers input signals to the phase position indicators 20 and 21. The phase position indicators 20, 21 are for example tristate buffers. The output signals from the tristate buffers are either 0, 1 or TRISTATE (high ohmic). The tristate buffers are controlled by the data pulses in the lines 12, 13 of the comparator 10 and said buffers, in co-operation with the resistor 23 and the capacitor 24, are adapted to integrate the output signal from the or each output line with reference to the duration of each pulse to a mean value which corresponds to the phase position between the data pulse and the clock signal. Similar behaviour can be obtained with analogue switches.

In this way, a voltage is created over the filter capacitor 24 which corresponds to the phase position between the front and the back edge of the data signal and the clock signal. Thus, this voltage is a measure of how well in the middle of the data pulse the data is clocked.

If a clock pulse is a little earlier or a little later than the previous pulse, the capacitor 24 will either be charged or discharged through the phase detector circuit 16 and thus the voltage Vdet will either increase or decrease. Thus, the voltage Vdet controls the VCO output phase to the right clock position.

The invention is not limited to the above described embodiments, instead several modifications may be made within the scope of the invention. If, for example, incoming data pulses only comprise unipolar RZ-pulses, the second phase position indicator 21 is not needed.

What is claimed is:

1. A phase detector arrangement for use in a phase locked loop circuit, for recovery of clock and data pulses from a data stream comprising Return to Zero (RZ) signals comprising digital data, said arrangement comprising a comparator, a phase detector, a loop filter and a voltage controlled oscillator, wherein the phase detector comprises a phase position indicator, having at least one tristate buffer, which is activated by each incoming data pulse in an output line of the comparator, said phase position indicator being adapted to control the voltage controlled oscillator in relation to both edges of each data pulse, for clocking data synchronously with said data pulse, and wherein the phase position indicator output is connected in series via a resistor to an earth-connected capacitor, for integration of the output signal with reference to the duration of each data pulse to a mean value which corresponds to a phase position between the data pulse and the clock signal.

2. An arrangement according to claim 1, wherein the output line of the phase detector is connected to the voltage controlled oscillator via the loop filter.

3. An arrangement according to claim 1, wherein the comparator is provided with two output lines coupled to two corresponding tristate buffers of the phase detector, one of the tristate buffers being activated for each incoming data pulse in the output lines of the comparator.

4. An arrangement according to claim 3, wherein the RZ signals are bipolar RZ signals.

5. An arrangement according to claim 4, wherein the comparator operates to convert the bipolar RZ signals to inverse RZ data.

6. An arrangement according to claim 3, wherein the tristate buffers are mutually connected to a connection point, and from said point, connected in series via the resistor to the earth-connected capacitor.

7. An arrangement according to claim 1, wherein the clock signal of the voltage controlled oscillator is used as input to the phase detector.

8. An arrangement according to claim 7, wherein the voltage over the capacitor is used for controlling the output phase of the voltage controlled oscillator.

9. An arrangement according to claim 1, wherein said arrangement is used in a telecommunication system.

10. A method for recovery of clock and data pulses from a data stream comprising digital signals being received by a comparator, comprising the steps of monitoring the data pulses in at least one output line of the comparator, controlling a voltage controlled oscillator in relation to both edges of each data pulse using a phase detector having at least one tristate buffer coupled to a corresponding output line of the comparator, for synchronizing with said data pulse, and integrating an input signal coupled to said at least one tristate buffer and controlled by each output line of the comparator with reference to the duration of each pulse to a mean value which corresponds to the phase position between each data pulse and the clock signal.

11. A method according to claim 10, wherein the input signal controlled by each output line of the comparator is the clock signal to be switched out of said at least one tristate buffer as a signal having pulses representing the phase position between each data pulse and the clock signal.

12. A phase detector arrangement for use in a phase locked loop circuit, for recovery of clock and data pulses from a data stream comprising Return to Zero (RZ) signals comprising digital data, said arrangement comprising a comparator, a phase detector, a loop filter and a voltage controlled oscillator, wherein the phase detector comprises a phase position indicator, having at least one analog switch, which is activated by each incoming data pulse in the output of the comparator, said phase position indicator being adapted to control the voltage controlled oscillator in relation to both edges of each data pulse, for clocking data synchronously with said data pulse, and wherein the phase position indicator output is connected in series via a resistor to an earth-connected capacitor, for integration of the output signal with reference to the duration of each data pulse to a mean value which corresponds to a phase position between the data pulse and the clock signal.

13. An arrangement according to claim 12, wherein the output line of the phase detector is connected to the voltage controlled oscillator via the loop filter.

14. An arrangement according to claim 12, wherein the comparator is provided with two output lines coupled to two corresponding analog switches of the phase detector, one of the analog switches being activated for each incoming data pulse in the output lines of the comparator.

15. An arrangement according to claim 14, wherein the RZ signals are bipolar RZ signals.

16. An arrangement according to claim 15, wherein the comparator operates to convert the bipolar RZ signals to inverse RZ data.

17. An arrangement according to claim 14, wherein the analog switches are mutually connected to a connection point, and from said point, connected in series via the resistor to the earth-connected capacitor.

18. An arrangement according to claim 12, wherein the clock signal of the voltage controlled oscillator is used as input to the phase detector.

19. An arrangement according to claim 18, wherein the voltage over the capacitor is used for controlling the output phase of the voltage controlled oscillator.

20. An arrangement according to claim 12, wherein said arrangement is used in a telecommunication system.

21. A method for recovery of clock and data pulses from a data stream comprising digital signals being received by a comparator, comprising the steps of:

monitoring the data pulses in at least one output line of the comparator;

controlling a voltage controlled oscillator in relation to both edges of each data pulse using a phase detector having at least one analog switch coupled to a corresponding output line of the comparator, for synchronizing a clock signal with said data pulse; and integrating an input signal coupled to said at least one analog switch and controlled by each output line of the comparator with reference to the duration of each pulse to a mean value which corresponds to the phase position between each data pulse and the clock signal.

22. A method according to claim 21, wherein the input signal controlled by each output line of the comparator is the clock signal to be switched out of said at least one analog switch as a signal having pulses representing the phase position between each data pulse and the clock signal.

* * * * *